United States Patent
Peng et al.

(10) Patent No.: US 11,990,193 B2
(45) Date of Patent: May 21, 2024

(54) ONE TIME PROGRAMMABLE (OTP) MEMORY ARRAY AND READ AND WRITE METHOD THEREOF

(71) Applicant: Chengdu Kiloway Electronics Co., Ltd., Chengdu (CN)

(72) Inventors: Jack Zezhong Peng, Chengdu (CN); Junhua Mao, Chengdu (CN)

(73) Assignee: Chengdu Kiloway Electronics Co., Ltd., Sichuan (CN)

( * ) Notice: Subject to any disclaimer, the term of this patent is extended or adjusted under 35 U.S.C. 154(b) by 176 days.

(21) Appl. No.: 17/868,241

(22) Filed: Jul. 19, 2022

(65) Prior Publication Data

US 2023/0124460 A1    Apr. 20, 2023

(30) Foreign Application Priority Data

Oct. 20, 2021  (CN) .......................... 202111220544.5

(51) Int. Cl.
| | |
|---|---|
| *G11C 16/04* | (2006.01) |
| *G11C 7/10* | (2006.01) |
| *G11C 7/20* | (2006.01) |
| *G11C 17/18* | (2006.01) |

(52) U.S. Cl.
CPC ............ *G11C 17/18* (2013.01); *G11C 7/1069* (2013.01); *G11C 7/20* (2013.01)

(58) Field of Classification Search
CPC .......... G11C 17/18; G11C 7/1069; G11C 7/20
See application file for complete search history.

(56) References Cited

U.S. PATENT DOCUMENTS

| | | | | |
|---|---|---|---|---|
| 7,206,214 B2 * | 4/2007 | Hoefler | ................... | G11C 17/16 |
| | | | | 365/185.26 |
| 7,609,578 B2 * | 10/2009 | Buer | ...................... | G11C 17/18 |
| | | | | 365/189.11 |
| 11,114,450 B2 * | 9/2021 | Choi | ........................ | H01L 29/51 |

FOREIGN PATENT DOCUMENTS

| | | |
|---|---|---|
| CN | 103219046 A | 7/2013 |
| CN | 105957555 A | 9/2016 |
| CN | 110827909 A | 2/2020 |

* cited by examiner

*Primary Examiner* — Pho M Luu
(74) *Attorney, Agent, or Firm* — Standley Law Group LLP; Jeffrey C. Norris; Kenny W. Pung

(57) ABSTRACT

A one time programmable OTP memory array and a read and write method thereof are provided. The OTP memory array includes M×N OTP memories, the OTP memories each include a storage MOS transistor, a first MOS transistor, a second MOS transistor and a detection MOS transistor, an isolation module is disposed between a control terminal of the detection MOS transistor and the storage MOS transistor; the isolation module includes at least one isolation MOS transistor; and in the array, a gate of each storage MOS transistor is connected to a same storage control point, each isolation MOS transistor is distinguished based on a distance from the storage MOS transistor, and gates of isolation MOS transistors with a same distance from the storage MOS transistor are connected to a same isolation control point.

4 Claims, 6 Drawing Sheets

ONE TIME PROGRAMMABLE (OTP) MEMORY ARRAY AND READ AND WRITE METHOD THEREOF

CROSS REFERENCE TO RELATED APPLICATION

This patent application claims the benefit and priority of Chinese Patent Application No. 202111220544.5, filed on Oct. 20, 2021, the disclosure of which is incorporated by reference herein in its entirety as part of the present application.

TECHNICAL FIELD

The present disclosure relates to the technologies of integrated circuits and OTP memories.

BACKGROUND ART

FIG. 1 to FIG. 4 show four conventional technologies. FIG. 1 shows a prototype of an Super Low-power Permanent Memory (XLPM) cell, FIG. 2 shows an XLPM cell with a read isolation device, FIG. 3 shows an XLPM cell with a high-voltage isolation device, and FIG. 4 shows an XLPM cell with a Native metal oxide semiconductor (MOS) gate capacitor.

Based on the XLPM cell shown in FIG. 1, a read isolation device M1 is added in FIG. 2 to isolate crosstalk among memory cells located on same bit lines BL and BR. In addition, due to the isolation of this device, it is no longer necessary to perform the clear operation on all cells, but only the memory cells on the word line to be read. This reduces the power consumption.

FIG. 3 incorporates a high-voltage isolation device of a cascade structure, with 2 V g-point voltage, which greatly reduces the leakage of MOS transistors M0 and M2 as well as the impact of high voltage on the MOS transistors. The voltage of the bit line BL and the word line WS can be reduced from 2.5 V to 1 V. In this way, the lateral decoding circuit of the whole memory array can be reduced by 40%.

The capacitor C0 in FIG. 4 adopts the Native MOS (0 Vt) gate capacitor. After programming is eliminated for the gate capacitor, the read voltage may experience a Vt voltage drop, thus the read voltage can be reduced to 0.5 V-0.6 V.

In summary, no high-voltage isolation device is used in structures in FIG. 1, FIG. 2 and FIG. 4, reliability of the MOS transistors M0 and M2 under high-voltage impact may be reduced, and larger tunneling gate leakage current of M0 and gate-induced drain leakage (GIDL) current of M2 may be caused.

No read isolation device is used in FIG. 1, FIG. 3, and FIG. 4, which requires global clearing and brings high currents.

The capacitor C0, the MOS transistor M3 and the MOS transistor M4 in FIG. 1, FIG. 2 and FIG. 3 cause Vt voltage drop.

In the structures in FIG. 1, FIG. 2, FIG. 3 and FIG. 4, the word lines need high-voltage decoding circuits with large area, and also need medium-voltage (3 V) decoding circuits. In addition, the word lines need to deal with high-low voltage switching, the bit lines need to deal with medium-low voltage switching, resulting in complex design of various voltage combinations, leakage risk caused by insufficient verification coverage, and numerous level conversion interface circuits.

In addition, peripheral circuits in FIG. 1, FIG. 2, FIG. 3 and FIG. 4 have the problem of high Vt voltage drop loss and high read voltage due to the use of thick gate oxygen devices (Vt is usually high, >0.7 V) in the medium-high voltage paths.

SUMMARY

The present disclosure intends to provide an OTP memory with long service life and high reliability.

The technical solutions used in the present disclosure to resolve the technical problem are as follows: An OTP memory array includes M×N OTP memories, the OTP memories each include a storage MOS transistor, a first MOS transistor, a second MOS transistor and a detection MOS transistor, a current connection terminal of the first MOS transistor is connected to a first current connection terminal of the detection MOS transistor, a control terminal of the detection MOS transistor is connected to a current connection point of the second MOS transistor, the control terminal of the detection MOS transistor is further connected to the storage MOS transistor, an isolation module is disposed between the control terminal of the detection MOS transistor and the storage MOS transistor, the storage MOS transistor is a Native MOS transistor, and M and N are both integers greater than 1; the isolation module includes at least one isolation MOS transistor, and the isolation MOS transistor is a Native MOS transistor; and in the array, a gate of each storage MOS transistor is connected to a same storage control point, each isolation MOS transistor is distinguished based on a distance from the storage MOS transistor, and gates of isolation MOS transistors with a same distance from the storage MOS transistor are connected to a same isolation control point.

The isolation module includes two isolation MOS transistors connected in series, an isolation MOS transistor directly connected to the storage MOS transistor is referred to as a first isolation MOS transistor, a gate of the first isolation MOS transistor is connected to a first isolation control point, an isolation MOS transistor connected to the second MOS transistor is referred to as a second isolation MOS transistor, and a gate of the second isolation MOS transistor is connected to a second isolation control point.

A method for performing a read operation on the OTP memory array includes:

R1: applying a turn-on voltage at the isolation control point;

R2: turning on second MOS transistors in OTP memories in the array, grounding reference points of all the OTP memories, and then turning off to clear charges of the reference points;

R3: applying a high level at the storage control point; and

R4: turning on a first MOS transistor in a selected OTP memory, detecting an on/off state of a detection MOS transistor to determine whether a storage MOS transistor in the selected OTP memory is broke down, so as to achieve data reading.

A method for performing a write operation on the OTP memory array includes:

W1: applying a high level at the storage control point;

W2: turning on isolation MOS transistors and a second MOS transistor in a selected OTP memory, such that a gate capacitor of a storage MOS transistor in the selected OTP memory is broke down, so as to achieve data writing.

Further, the isolation module includes two isolation MOS transistors connected in series, an isolation MOS transistor directly connected to the storage MOS transistor is referred to as a first isolation MOS transistor, a gate of the first isolation MOS transistor is connected to a first isolation control point, an isolation MOS transistor connected to the second MOS transistor is referred to as a second isolation MOS transistor, and a gate of the second isolation MOS transistor is connected to a second isolation control point. Correspondingly, the method for performing a write operation includes:

W1: applying a high level at the storage control point;

W2: turning on a first isolation MOS transistor, a second isolation MOS transistor and a second MOS transistor in a selected OTP memory, such that a gate capacitor of a storage MOS transistor in the selected OTP memory is broke down, so as to achieve data writing, where a voltage applied to a gate of the first isolation MOS transistor is higher than a voltage applied to a gate of the second isolation MOS transistor.

The isolation MOS transistor used in the present disclosure isolates crosstalk among memory cells on the same bit lines. Compared with the technology shown in FIG. 2, the isolation MOS transistor has an additional function, that is, being used as a word line selection device during the read operation. In the present disclosure, there are one or more stages of high-voltage isolation devices, to avoid high voltage impact on the detection MOS transistor and the second MOS transistor that affects the service life and reliability, thereby reducing the tunneling gate leakage current of the detection MOS transistor, reducing the GIDL current of M2, and making programming easier. When programming, high-voltage (8 V or more) word lines WP and medium-voltage (3 V-5 V) word lines WB (H, L) can adopt a common connection mode, instead of using a medium-high voltage word line decoder with a large area and a complex structure. Word line selection is performed through the low-voltage (0.5 V-2 V) WS, and bit line selection is also performed through the low-voltage (0.5 V-2 V) BL and BR, Peripheral decoder circuits may all use low-voltage devices, greatly simplifying the design of the decoders and reducing the area of the peripheral circuits.

The storage MOS transistor in the present disclosure uses the Native (0 Vt) MOS capacitor, and the isolation MOS transistor also uses the Native MOS device, such that there is no Vt voltage drop loss in the path of WP-C0-WB-g-point during the read operation. As long as Vg>0.5 V, that is, higher than the turn-on voltage of M0, the read operation can be performed without boost circuit. Compared with the prior art, the present disclosure abandons the boost circuit, thereby reducing the cost.

In the present disclosure, if one stage of Native high-voltage isolation device is adopted, the voltage reaching the g-point is about 3 V (WB=3 V) or 4 V (WB=4 V), and there is still the risk of high-voltage impact and leakage; while if two stages of Native high-voltage isolation devices are adopted, high-voltage isolation can be better realized, and M0 and M2 have low voltage, which can greatly reduce the current and leakage improve the programming effect. The quantity of stages of high-voltage isolation devices depends on the voltage applied to the devices and the voltage endurance capability of the devices.

In the 180 nm process, for example, due to the use of a common high voltage path WP and a low-medium voltage path WBx, the high-voltage module on the path only has a charge pump, and the charge pump is a step-up structure and uses only thin gate devices. Through design optimization, a voltage difference between the stages is always within the safe range. In this way, all thick gate (3.3 V/5 V/15.5 V) devices can be removed, and thin grid (1.8 V only) devices may be used for the whole memory, reducing 3-layer mask cost and corresponding processing cost compared with the prior art (1.8 V/3.3 V Dual Gate).

DETAILED DESCRIPTION OF THE EMBODIMENTS

A current connection terminal in the present disclosure refers to a terminal, that is, a source terminal or a drain terminal, of a current channel of an MOS transistor. A control terminal refers to a gate terminal. These can be clearly understood by a person of ordinary skill in combination with the specification and the accompanying drawings of the present disclosure.

Embodiment 1

Figure 1:
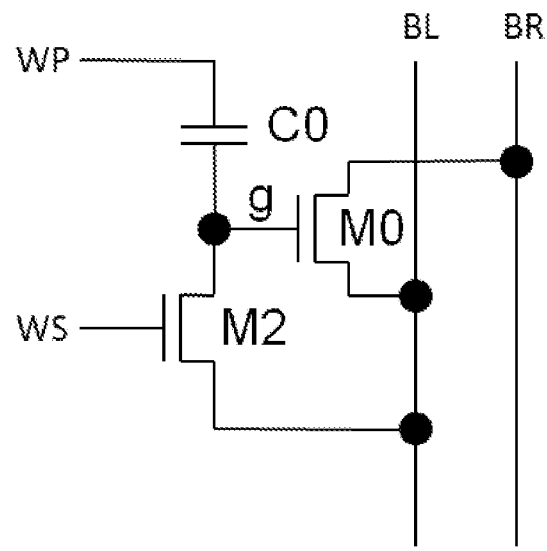
FIG. 1 is a circuit diagram of a prototype of an XLPM cell.
Figure 2:
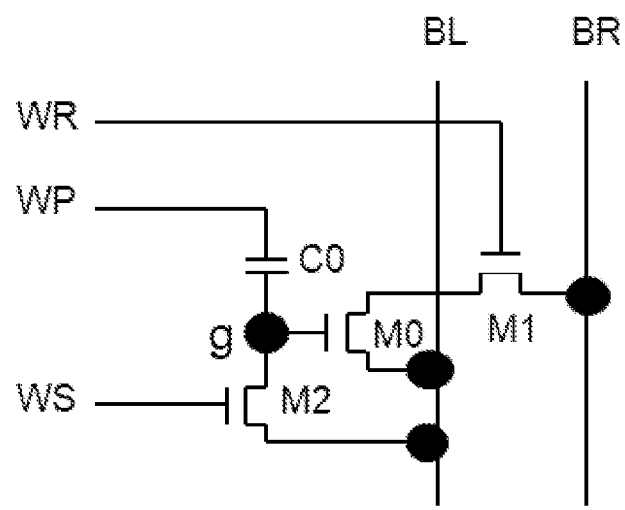
FIG. 2 is a circuit diagram of an XLPM cell with a read isolation device.
Figure 3:
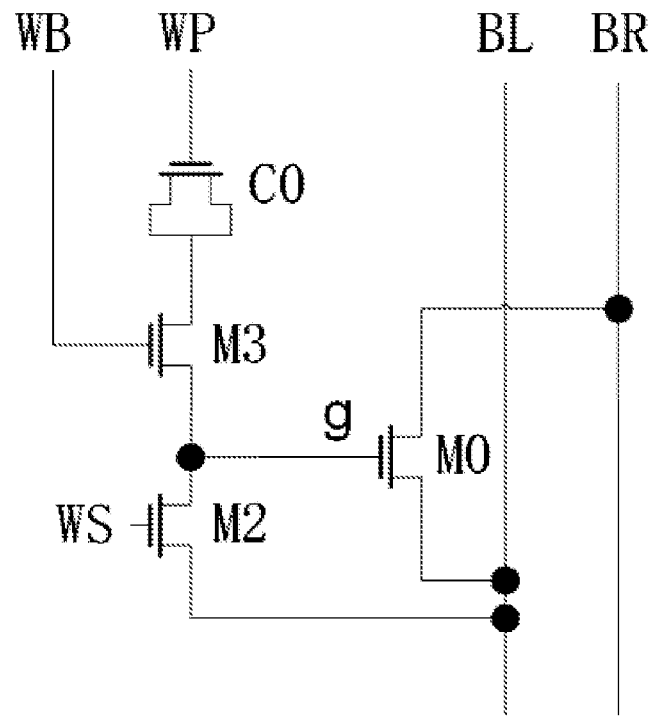
FIG. 3 is a circuit diagram of an XLPM cell with a high-voltage isolation device.
Figure 4:
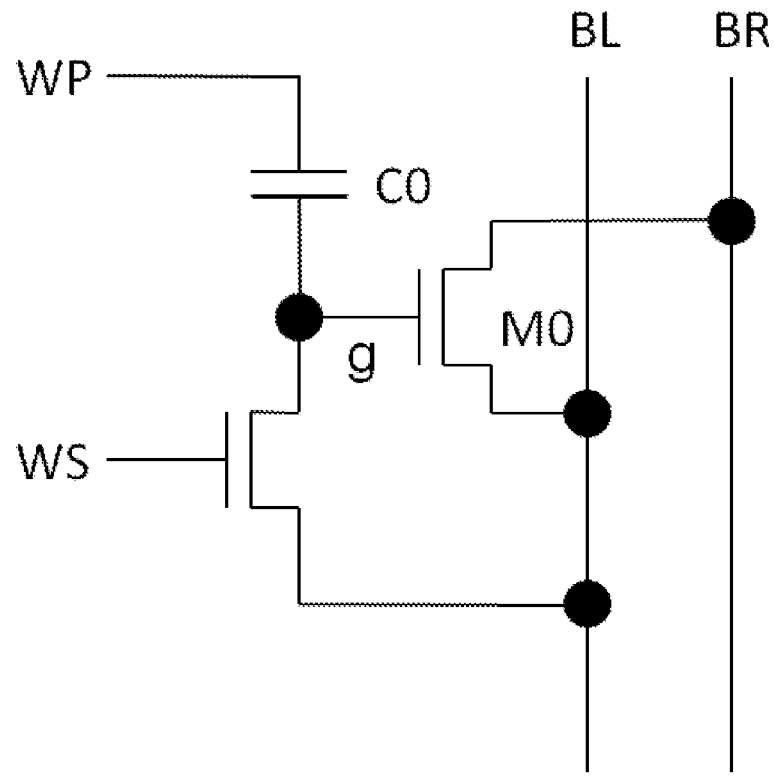
FIG. 4 is a circuit diagram of an XLPM cell with a Native MOS Cap.
Figure 5:
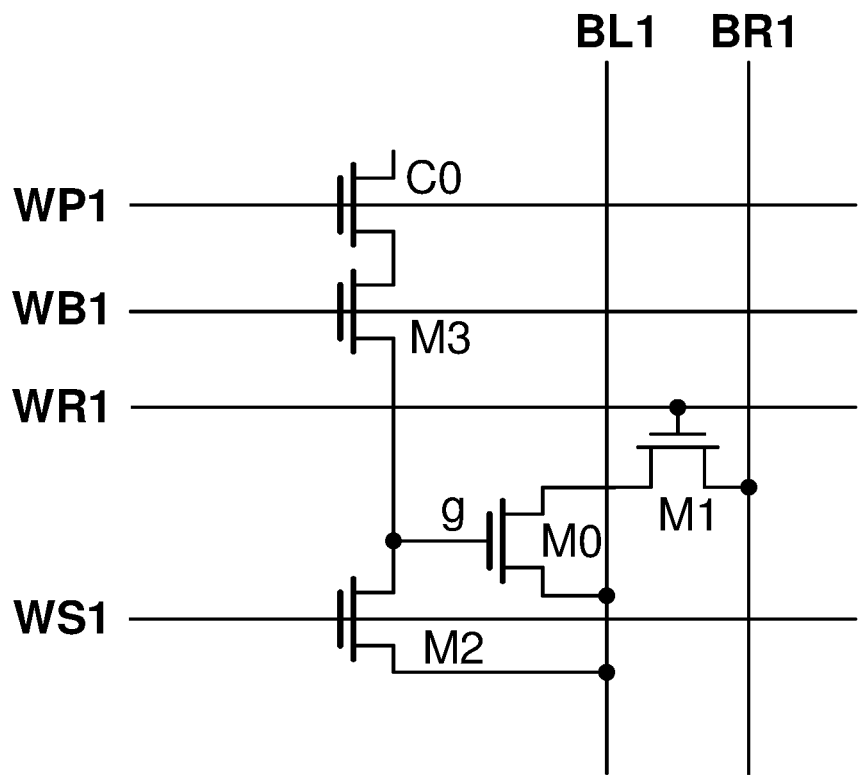
FIG. 5 is a circuit diagram of an OTP memory using one stage of high-voltage isolation device according to the present disclosure.

Referring to FIG. 5, this embodiment includes a storage MOS transistor C0, a first MOS transistor M1, a second MOS transistor M2 and a detection MOS transistor M0. A current connection terminal of the first MOS transistor M1 is connected to a first current connection terminal of the detection MOS transistor M0, a control terminal of the detection MOS transistor M0 is connected to a current connection point of the second MOS transistor M2, the control terminal of the detection MOS transistor M0 is further connected to the storage MOS transistor C0, and an isolation module is disposed between the control terminal of the detection MOS transistor M0 and the storage MOS transistor C0.

The storage MOS transistor C0 is a Native MOS transistor, and the isolation module is a Native MOS transistor M3.

Embodiment 2

Figure 6:
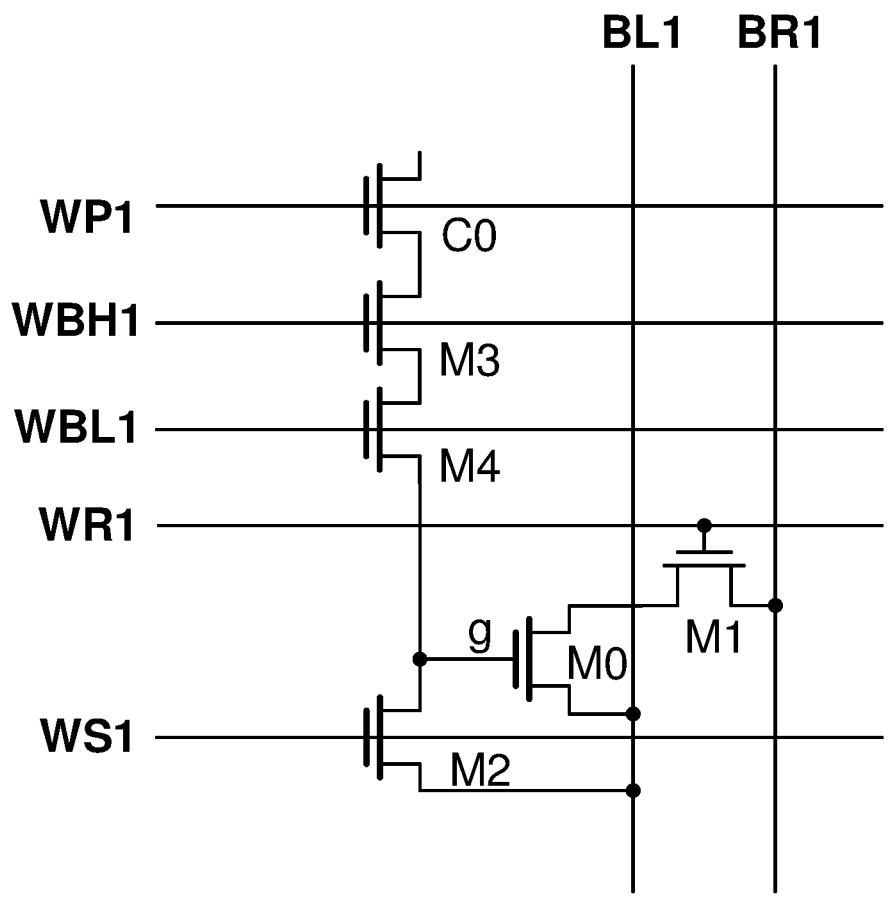
FIG. 6 is a circuit diagram of an OTP memory using two stages of high-voltage isolation devices according to the present disclosure.

Referring to FIG. 6, this embodiment includes a storage MOS transistor C0, a first MOS transistor M1, a second MOS transistor M2 and a detection MOS transistor M0. A current connection terminal of the first MOS transistor M1 is connected to a first current connection terminal of the detection MOS transistor M0, a control terminal of the detection MOS transistor M0 is connected to a current connection point of the second MOS transistor M2, the control terminal of the detection MOS transistor M0 is further connected to the storage MOS transistor C0, and an isolation module is disposed between the control terminal of the detection MOS transistor M0 and the storage MOS transistor C0.

The storage MOS transistor C0 is a Native MOS transistor, and the isolation module consists of two Native MOS transistors connected in series, referring to the Native MOS transistors shown as M3 and M4 in FIG. 6.

Embodiment 3

Figure 7:
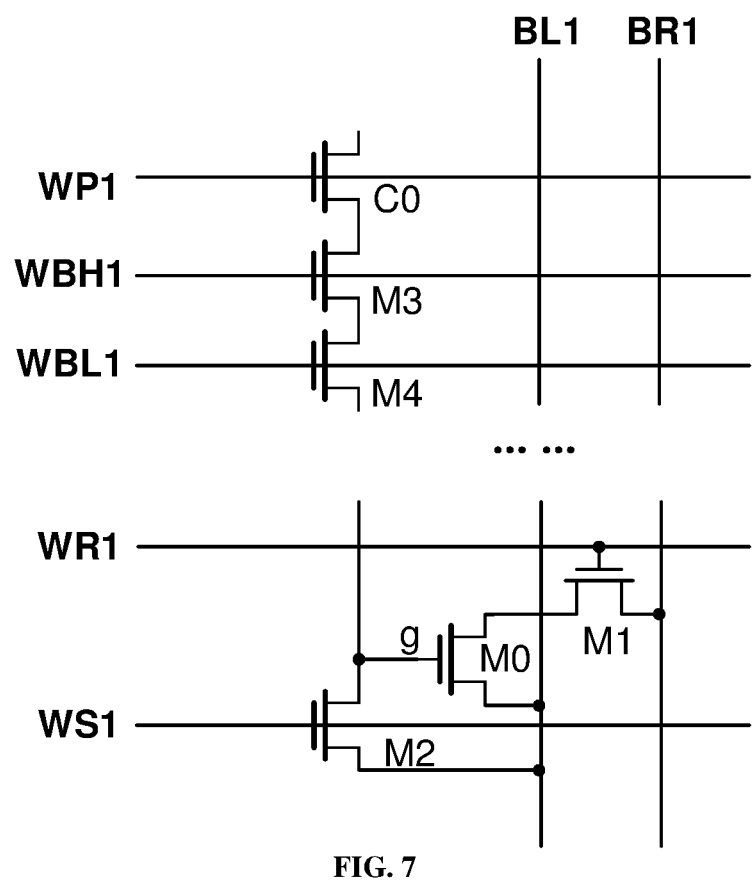
FIG. 7 is a circuit diagram of an OTP memory using multi-stage of high-voltage isolation devices according to the present disclosure.

Referring to FIG. 7, this embodiment includes a storage MOS transistor C0, a first MOS transistor M1, a second MOS transistor M2 and a detection MOS transistor M0. A current connection terminal of the first MOS transistor M1 is connected to a first current connection terminal of the detection MOS transistor M0, a control terminal of the detection MOS transistor M0 is connected to a current connection point of the second MOS transistor M2, the control terminal of the detection MOS transistor M0 is further connected to the storage MOS transistor C0, and an isolation module is disposed between the control terminal of the detection MOS transistor M0 and the storage MOS transistor C0.

For example, gates of storage MOS transistors in the first row are connected to the word line WP1 and gates of isolation MOS transistors in the first row are connected to the word line WB1.

Gate of storage MOS transistors in the second row are connected to the word line WP2 and gates of isolation MOS transistors in the second row are connected to the word line WB2.

As a feature of the present disclosure, the word lines for connecting the gates of the storage MOS transistors in the array are all connected to a common connection point referred to as a storage control point, and the word lines for connecting the gates of the isolation MOS transistors are all connected to a common connection point referred to as an isolation control point.

For example, WP1, WP2, . . . , and WPx are connected, and WB1, WB2, . . . , and WBx are connected.

In the figure, BL1, BL2, BR1, BR2 indicate bit lines.

In the 180 nm process, a typical programming operation is shown in Table 1, and other processes have similar operations, only differing in the voltage values.

TABLE 1

| | Cell | WP (V) | WB (V) | WR (V) | WS (V) | BL (V) | BR (V) |
|---|---|---|---|---|---|---|---|
| Write | ASW/SB | 9 | 4 | 0 | 1.5 | 0 | float/1.5 |
| | BSW/UB | 9 | 4 | 0 | 1.5 | float/1.5 | float/1.5 |
| | CUW/SB | 9 | 4 | 0 | 0 | 0 | float/1.5 |
| | DUW/UB | 9 | 4 | 0 | 0 | float/1.5 | float/1.5 |
| Read | ASW/SB | 0.5 | 0.5 | 0.5 | Pulse, 0 | 0 | Vsen |
| | BSW/UB | 0.5 | 0.5 | 0.5 | Pulse, 0 | 0/float | float/0 |
| | CUW/SB | 0.5 | 0.5 | 0 | 0/Pulse, 0 | 0 | Vsen |
| | DUW/UB | 0.5 | 0.5 | 0 | 0/Pulse, 0 | 0/float | float/0 |

The storage MOS transistor C0 is a Native MOS transistor, and the isolation module consists of at least 3 Native MOS transistors connected in series.

Embodiment 4

Figure 8:
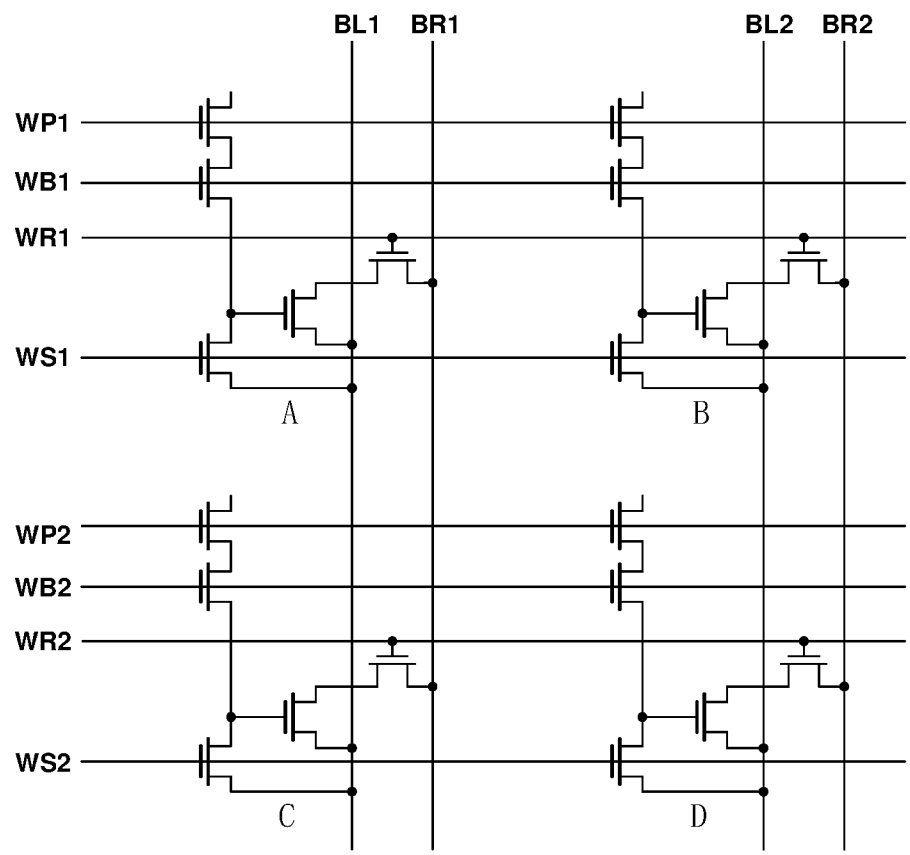
FIG. 8 is a circuit diagram of an OTP memory array using one stage of high-voltage isolation device according to the present disclosure.

Referring to FIG. 8, this embodiment provides a Native XLPM memory array using one stage of high-voltage isolation device. In the array, gates of each row of storage MOS transistors C0 are connected to a word line WP of that row, and gates of isolation MOS transistors are connected to another word line WB of that row.

Embodiment 5

Figure 9:
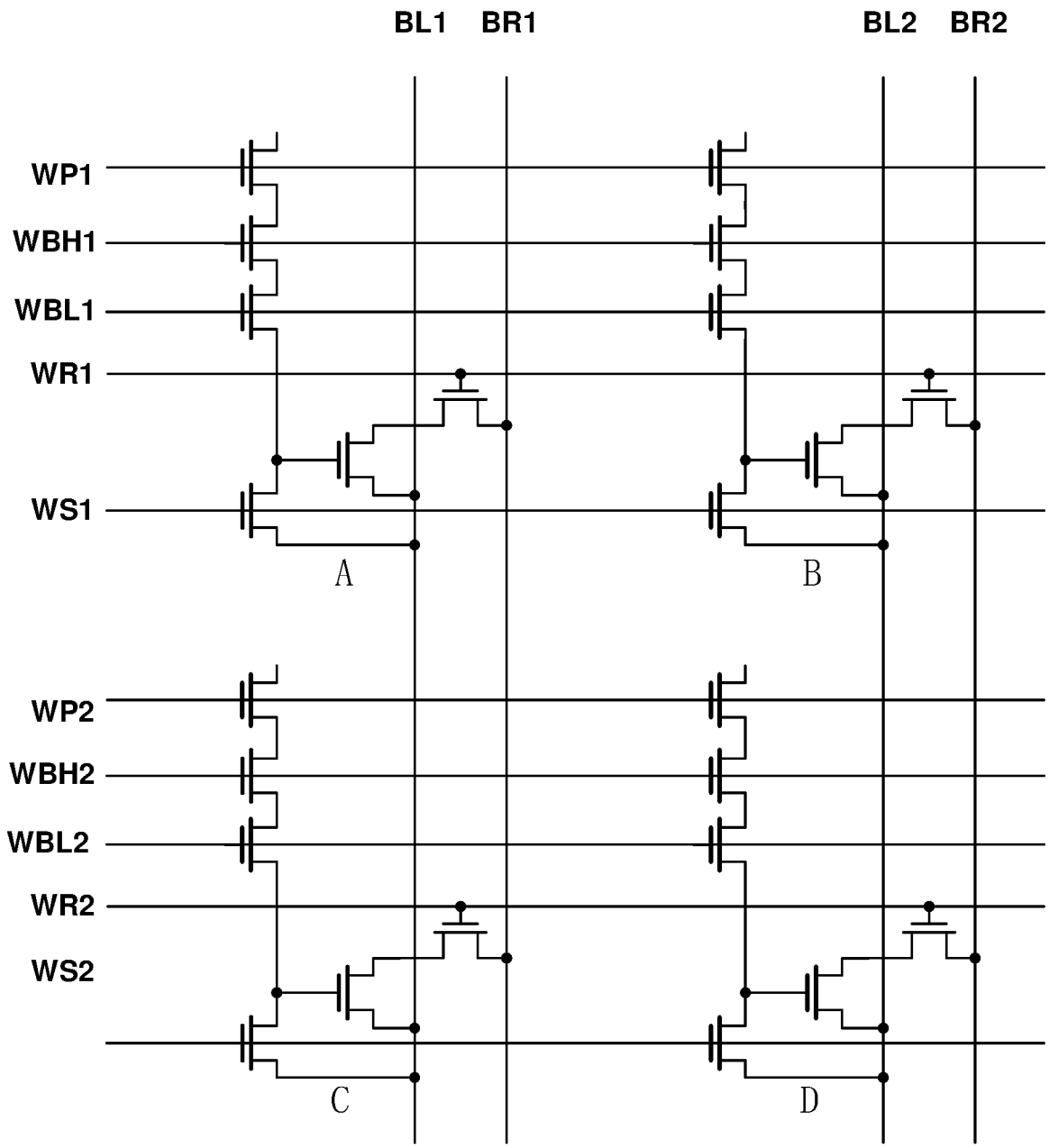
FIG. 9 is a circuit diagram of an OTP memory array using two stages of high-voltage isolation devices according to the present disclosure.

Referring to FIG. 9, this embodiment provides a Native XLPM memory array using two stages of high-voltage isolation devices.

In the 180 nm process, a typical programming operation is shown in Table 2, and other processes have similar operations, only differing in the voltage values.

TABLE 2

| | Cell | WP (V) | WBH (V) | WBL (V) | WR (V) | WS (V) | BL (V) | BR (V) |
|---|---|---|---|---|---|---|---|---|
| Write | A SW/SB | 9 | 4 | 1.5 | 0 | 1.5 | 0 | float/1.5 |
| | B SW/UB | 9 | 4 | 1.5 | 0 | 1.5 | float/1.5 | float/1.5 |
| | C UW/SB | 9 | 4 | 1.5 | 0 | 0 | 0 | float/1.5 |
| | D UW/UB | 9 | 4 | 1.5 | 0 | 0 | float/1.5 | float/1.5 |
| Read | A SW/SB | 0.5 | 0.5 | 0.5 | 0.5 | Pulse, 0 | 0 | Vsen |
| | B SW/UB | 0.5 | 0.5 | 0.5 | 0.5 | Pulse, 0 | 0/float | float/0 |
| | C UW/SB | 0.5 | 0.5 | 0.5 | 0 | 0/Pulse, 0 | 0 | Vsen |
| | D UW/UB | 0.5 | 0.5 | 0.5 | 0 | 0/Pulse, 0 | 0/float | float/0 |

What is claimed is:

1. A one time programmable (OTP) memory array, comprising M×N OTP memories, wherein the OTP memories each comprise a storage metal oxide semiconductor (MOS) transistor (C0), a first MOS transistor (M1), a second MOS transistor (M2) and a detection MOS transistor (M0), a current connection terminal of the first MOS transistor (M1) is connected to a first current connection terminal of the detection MOS transistor (M0), a control terminal of the detection MOS transistor (M0) is connected to a current connection point of the second MOS transistor (M2), the control terminal of the detection MOS transistor (M0) is further connected to the storage MOS transistor (C0), an isolation module is disposed between the control terminal of the detection MOS transistor (M0) and the storage MOS transistor (C0), the storage MOS transistor is a Native MOS transistor, and M and N are both integers greater than 1;

wherein, the isolation module comprises at least one isolation MOS transistor, and the isolation MOS transistor is a Native MOS transistor; and in the array, a gate of each storage MOS transistor is connected to a same storage control point, each isolation MOS transistor is distinguished based on a distance from the storage MOS transistor, and gates of isolation MOS transistors with a same distance from the storage MOS transistor are connected to a same isolation control point.

2. The OTP memory array according to claim 1, wherein the isolation module comprises two isolation MOS transistors connected in series, an isolation MOS transistor directly connected to the storage MOS transistor is referred to as a first isolation MOS transistor, a gate of the first isolation MOS transistor is connected to a first isolation control point, an isolation MOS transistor connected to the second MOS transistor is referred to as a second isolation MOS transistor, and a gate of the second isolation MOS transistor is connected to a second isolation control point.

3. A read and write method of a one time programmable (OTP) memory array, wherein the OPT memory array comprises M×N OTP memories, the OTP memories each comprise a storage metal oxide semiconductor (MOS) transistor, a first MOS transistor, a second MOS transistor and a detection MOS transistor, a current connection terminal of the first MOS transistor is connected to a first current connection terminal of the detection MOS transistor, a control terminal of the detection MOS transistor is connected to a current connection point of the second MOS transistor, the control terminal of the detection MOS transistor is further connected to the storage MOS transistor, an isolation module is disposed between the control terminal of the detection MOS transistor and the storage MOS transistor, the storage MOS transistor is a Native MOS transistor, and M and N are both integers greater than 1; and in the array, a gate of each storage MOS transistor is connected to a same storage control point, each isolation MOS transistor is distinguished based on a distance from the storage MOS transistor, and gates of isolation MOS transistors with a same distance from the storage MOS transistor are connected to a same isolation control point;

wherein, a method for performing a read operation on the OTP memory array comprises:

R1: applying a turn-on voltage at the isolation control point;

R2: turning on second MOS transistors in OTP memories in the array, grounding reference points of all the OTP memories, and then turning off to clear charges of the reference points;

R3: applying a high level at the storage control point; and

R4: turning on a first MOS transistor in a selected OTP memory, detecting an on/off state of a detection MOS transistor to determine whether a storage MOS transistor in the selected OTP memory is broke down, so as to achieve data reading; and a method for performing a write operation on the OTP memory array comprises:

W1: applying a high level at the storage control point;

W2: turning on isolation MOS transistors and a second MOS transistor in a selected OTP memory, such that a gate capacitor of a storage MOS transistor in the selected OTP memory is broke down, so as to achieve data writing.

4. The read-write method of an OTP memory array according to claim 3, wherein the isolation module comprises two isolation MOS transistors connected in series, an isolation MOS transistor directly connected to the storage MOS transistor is referred to as a first isolation MOS transistor, a gate of the first isolation MOS transistor is connected to a first isolation control point, an isolation MOS transistor connected to the second MOS transistor is referred to as a second isolation MOS transistor, and a gate of the second isolation MOS transistor is connected to a second isolation control point; and the method for performing a write operation comprises:

W1: applying the high level at the storage control point;

W2: turning on a first isolation MOS transistor, a second isolation MOS transistor and a second MOS transistor in a selected OTP memory, such that a gate capacitor of a storage MOS transistor in the selected OTP memory is broke down, so as to achieve data writing, wherein a voltage applied to a gate of the first isolation MOS transistor is higher than a voltage applied to a gate of the second isolation MOS transistor.

* * * * *